United States Patent [19]
Fujita

[11] Patent Number: 5,706,126
[45] Date of Patent: Jan. 6, 1998

[54] OPTICAL AMPLIFIER

[75] Inventor: Masayuki Fujita, Tokyo, Japan

[73] Assignee: NEC Corporation, Tokyo, Japan

[21] Appl. No.: 707,391

[22] Filed: Sep. 4, 1996

[30] Foreign Application Priority Data

Sep. 14, 1995 [JP] Japan ................... 7-236535

[51] Int. Cl.$^6$ .................... H04B 10/16; H01S 3/131
[52] U.S. Cl. .................... 359/341; 359/160; 359/345
[58] Field of Search ...................... 359/134, 160, 359/194, 337, 341, 345

[56] References Cited

U.S. PATENT DOCUMENTS

| | | | |
|---|---|---|---|
| 5,117,196 | 5/1992 | Epworth et al. | 359/333 |
| 5,343,320 | 8/1994 | Anderson | 359/160 |
| 5,471,334 | 11/1995 | Masuda et al. | 359/177 |
| 5,506,724 | 4/1996 | Shimizu et al. | 359/341 |
| 5,510,926 | 4/1996 | Boyart et al. | 359/179 |
| 5,600,481 | 2/1997 | Nababayashi | 359/341 |

FOREIGN PATENT DOCUMENTS 6338874 12/1994 Japan .

OTHER PUBLICATIONS

Fimgibl, M; Electronics Letters; vol. 27, #7, pp. 560–561, Mar. 28, 1991.
Deservire, B; Physics Today, pp. 20–27, Jan. 1994.

*Primary Examiner*—Nelson Moskowitz
*Attorney, Agent, or Firm*—Whitham, Curtis, Whitham & McGinn

[57] ABSTRACT

A second optical branching coupler and a second light sensor are additionally provided at the output side of the optical amplifier, in addition to a first optical branching filter for branching part of the light outputted from the optical amplifier and a first light sensor for measurement of the level of the branching light. Provided between the first light sensor and the second light sensor is a band-pass filter which allows passage of only light with specific wavelengths, for measurement of the level of the light with specific wavelengths. The difference between the levels of the outputted light measured by the first light sensor and the light with specific wavelengths measured by the second light sensor is calculated by a subtracting process to control the gain of the optical amplifier on the basis of the result of the subtracting process. The band-pass filter is provided for removal of amplified spontaneous emission from the optical output. The band-pass filter allows only the amplified spontaneous emission to pass. Since the feedback is controlled free from the influence of the amplified spontaneous emission, a constant optical output is maintained with high precision.

15 Claims, 6 Drawing Sheets

OPTICAL AMPLIFIER

BACKGROUND OF THE INVENTION

1. Field of the Invention

This invention relates to an optical amplifier which is used for optical communications and optical information processing, and more particularly to an optical amplifier which maintains a constant level of amplified signal light with high precision.

2. Description of the Related Art

Hitherto-known optical amplifier which directly amplify optical signals include optical fiber amplifiers which use optical fiber the inside of the core of which is doped with a rare earth element as the amplifying medium or semiconductor amplifiers which utilize a stimulated emission phenomena which occurs inside the semiconductors.

In order to maintain a constant transmission level of the system to thereby stabilize the transmission characteristics when such an optical amplifier is used as the light-transmitting apparatus, it is necessary to keep a constant optical output of the optical signal outputted from the optical amplifier. For example, an optical fiber amplifier being put to practical use contains an optical branching coupler in the optical output section. Part of the optical output, which is branched and received by a light sensor, is converted into electric output for measurement of the level. The measured level is used to control the pumping light from the pumping light source, thereby controlling the gain of the optical fiber amplifier to maintain a constant optical output.

With optical amplifiers of the prior art, however, it is difficult to maintain a constant optical signal output even when the level of the optical output is measured with high precision to exactly set the gain of the optical amplifier. The cause of the above problem is that the optical output from optical amplifiers includes the amplified optical signal as well as amplified spontaneous emission generated in the optical amplifier itself. The amplified spontaneous emission is within a wide spectral range, and its power changes with the input optical power of the optical amplifier. This makes it hard to discriminate the amplified optical signal from the output power from the optical amplifier.

The present inventors have investigated the characteristics of the amplified spontaneou emission, and this invention is a solution thereto.

Particularly, in the case of ultralong-haul submarine optical fiber transmission systems constructed of concatenated optical amplifiers, variations in the optical signal output are accumulated each time the signal passes through each optical amplifier, thus making the problem severe.

SUMMARY OF THE INVENTION

It is an object of this invention to provide an optical amplifier which maintains the optical signal output therefrom at a constant level, as a solution to the above problem of the optical amplifier of the prior art.

The optical amplifier according to this invention is different from the configuration of the prior art wherein part of the light amplified and outputted through the light-amplifying section is directly subjected to measurement of the level to control the feedback. Specifically, the optical amplifier according to this invention is designed to extract the remainder of the amplified light from which amplified spontaneous emission (ASE) has been removed, that is, the pure signal light only. The feedback is controlled on the basis of the level of the pure signal light to thereby control the gain of the light-amplifying section.

More specifically, a second optical branching filter and a second light sensor are additionally provided at the output side of the optical amplifier, in addition to a first optical branching coupler for branching part of the light outputted from the optical amplifier and a first light sensor for measurement of the branching light. Provided between the second branching coupler and the second light sensor is a band-pass filter which allows passage of only light with specific wavelengths, for measurement of the level of the light with specific wavelengths. The difference between the levels of the outputted light measured by the first light sensor and the light with specific wavelengths measured by the second light sensor is calculated by a subtracting process. The gain of the optical amplifier is controlled on the basis of the result of the subtracting process.

Here, the band-pass filter is provided for sampling of part of the amplified spontaneous emission from the optical output. The band-pass filter used is designed to have a pass band which allows passage of only light with wavelengths which are near but exclude the center wavelength of the inputted signal light. In order to remove the amplified spontaneous emission from the first branching light, the subtracting means subtracts the value obtained by multiplying the output of the light with specific wavelengths by a predetermined constant, from the optical output of the first branching light. The artificial level of the amplified spontaneous emission is calculated by multiplying the level monitored with the second light sensor (the level of the light passing through the band-pass filter) by the predetermined constant. The level of the amplified pure signal light alone can be calculated by subtracting the multiplication product from the level of the first branching light.

Use of the foregoing configuration allows control of the feedback while free from the influence of the amplified spontaneous emission, and this maintains a constant optical output with high precision.

With the configuration described above, the amplified branching signal light is directly subjected to measurement of the level by the first light sensor. Further, it is also possible to place another band-pass filter which allows passage of light with specific wavelengths upstream from the first light sensor to control the gain with higher precision. More specifically, only a portion of the first branching light, which has wavelengths equal to or near the center wavelength of the inputted signal light, is allowed to pass. In contrast, the second branching light is designed so that only a portion thereof passes which has wavelengths near but unequal to the center wavelength of the inputted signal light.

The configuration designed in this way results in inclusion of only the amplified spontaneous emission with wavelengths near the center wavelength in the first branching light, when subjected to the subtracting process. The precision of the artificial level of the amplified spontaneous emission to be subtracted from the level of the second branching light is increased. As a result, the level of only the amplified signal light is calculated with higher precision than in the case where the amplified spontaneous emission is removed from the full-wavelength band at a stroke. Accordingly, the gain of the light-amplifying section may also be controlled with higher precision.

Specifically, the gain of the optical amplifier is controlled through control of the current to be injected into the pumping light source when the apparatus is an optical fiber amplifier. On the other hand, the control is accomplished through control of the current to be injected into the semiconductor in cases where the apparatus is a semiconductor optical amplifier.

BRIEF DESCRIPTION OF THE DRAWINGS

The above and other objects, features and advantages of this invention will become more apparent from the following detailed description when taken in conjunction with the accompanying drawings wherein.

DETAILED DESCRIPTION OF THE PREFERRED EMBODIMENTS

Prior to description of the optical amplifier according to this invention, an optical amplifier of the prior art will now be explained to facilitate understanding of the invention.

Figure 1:
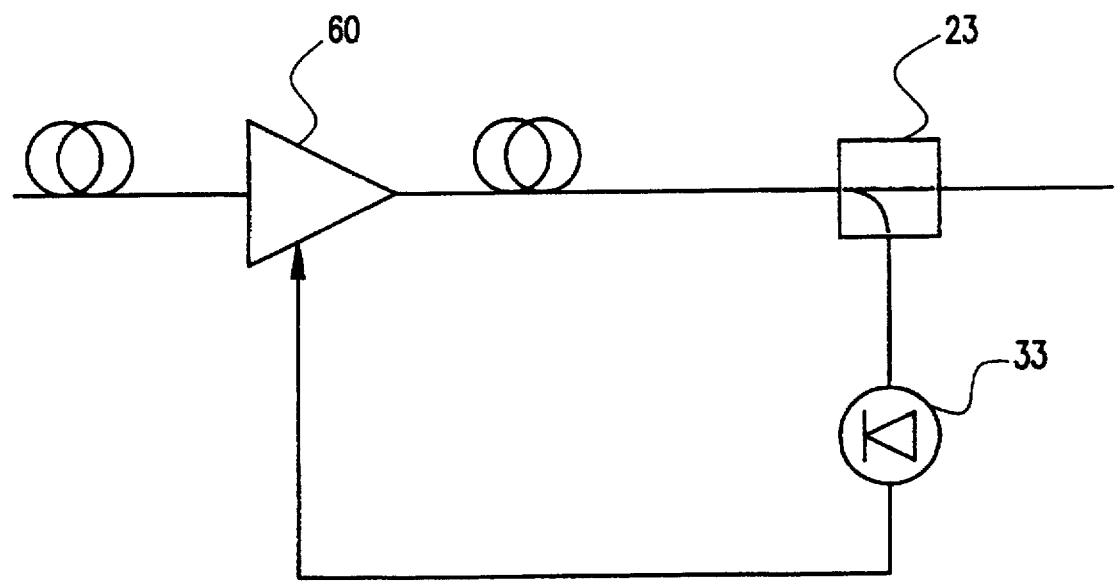
FIG. 1 is a schematic diagram illustrative of an optical amplifier of the prior art.

FIG. 1 is a schematic diagram illustrative of an optical amplifier of the prior art. As an example, the optical fiber amplifier of the prior art which is illustrated in FIG. 1 is designed in such a manner that an optical branching filter 23 is placed in addition to an optical output section 60, and a branch of the optical output is sensed and converted into electric output by a light sensor 33 for measurement of the level. The level is then used to control the output of the pumping light from a pumping light source to thereby maintain a constant optical output through control of the gain of the optical fiber amplifier.

With the optical amplifier of the prior art which controls the feedback through simple measurement of the level of the optical output, however, it is difficult to maintain a constant optical output even in cases where the level of the optical output is measured with high precision to precisely set the gain of the optical amplifier. The present inventors have investigated the above problem of the prior art to find the cause, and this invention is a solution thereto.

Light-amplifying media of both optical fiber amplifiers and semiconductor amplifiers output amplified spontaneous emission generated inside the light-amplifying media in addition to the amplified signal light. Therefore, with the design of the conventional optical fiber amplifiers in which the amplified light is directly received by light sensors for the feedback control, it is difficult to maintain a constant level of the outputted light with precision under influence of the amplified spontaneous emission. This is because the cause of the difficulty is believed to be unnecessary feedback control of the otherwise constant level of the signal light which is caused by the change in the quantity of the amplified spontaneous emission which is contained in the amplified light.

The optical amplifier according to this invention will now be explained in detail with reference to the drawings.

Figure 2:
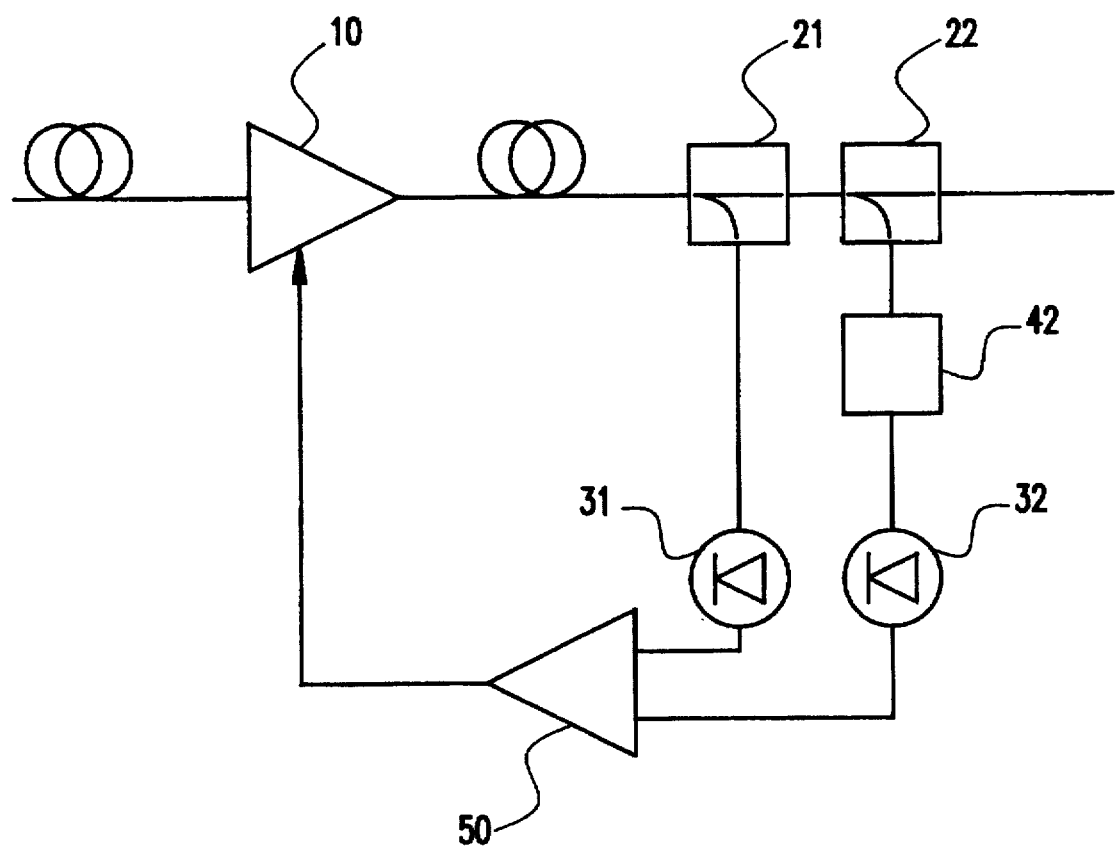
FIG. 2 is a schematic view of an embodiment of the optical amplifier according to this invention.

FIG. 2 is a schematic view of an embodiment of the optical amplifier according to this invention. The optical amplifier according to this invention is equipped with a light-amplifying section 10 for directly amplifying inputted light, an optical branching coupler 21 placed at the output side of the light-amplifying section 10, and a light sensor 31 for receiving branching light from the optical branching coupler 21 for measurement of the level.

The optical amplifier according to this invention is also equipped with another optical branching coupler 22 which branches part of the outputted light in the same manner as the optical branching coupler 21. The level of the outputted light branching from the optical branching coupler 22 is measured by another light sensor 32. Here, placed between the optical branching coupler 22 and the light sensor 32 is a band-pass filter 42 which allows only light with predetermined specific wavelengths to pass.

Figure 3A:
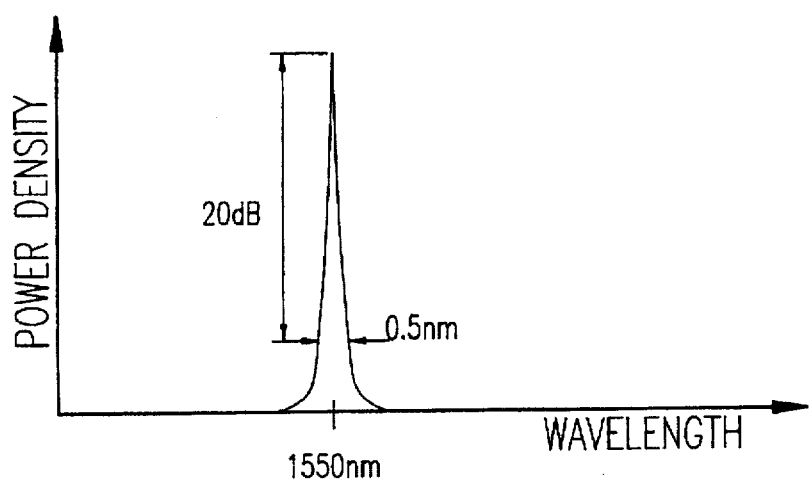
FIG. 3 (a)–(c) illustrate views of the spectra of light observed at several positions in the embodiment of the optical amplifier according to this invention.

The operational principle of the optical amplifier according to this invention will now be explained with reference to FIGS. 3(a)–(c). FIG. 3(a) illustrates the spectrum of signal light inputted to the optical amplifier according to this invention.

Figure 3B:
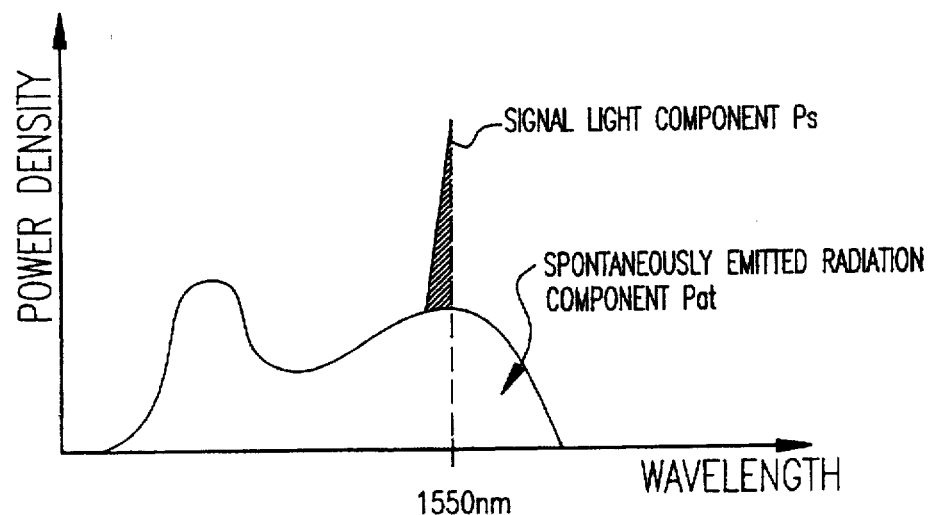
Figure 3C:
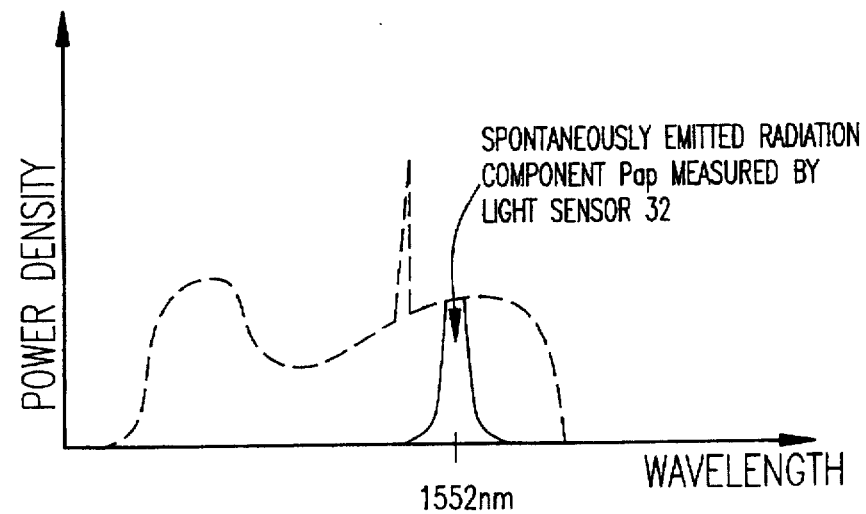

According to the embodiment illustrated in FIG. 3, the center wavelength is 1,550 nm, and the 20 dB suppression width is 0.5 nm. When this signal light is amplified through the optical amplifier 10, the sum of the amplified signal light and the amplified spontaneous emission generated inside the optical amplifier is outputted from the light-amplifying section 10, as illustrated in FIG. 3(b). For convenience in the description of the amplified light which follows, the pure signal light component is referred to as "amplified signal light", where the sum of the amplified signal light and the amplified spontaneous emission is referred to as "amplified light" to distinguish between them.

Part of the amplified light is branched through the optical branching coupler 21, and the total optical output which includes the light with the same wavelengths as illustrated in FIG. 3(b) is measured by the light sensor 31. Specifically, the total optical output Pt which is measured by the light sensor 32 is the sum of the amplified signal light component Ps and the amplified spontaneous emission Pat, represented by the following equation:

$$Pt = Ps + Pat \quad (1)$$

In contrast, placed between the optical branching coupler 22 and the light sensor 32 is the band-pass filter 42 which admits light with the center wavelength of 1,552 nm, with the 20 dB suppression width being 1.5 nm, and the suppression quantity of the signal light being 30 dB or more at a wavelength of 1,550 nm. The amplified and branched signal light passes through the band-pass filter 42 to become light having such a spectrum as illustrated in FIG. 3(c). Eventually the light sensor 32 measures the level of the optical output which is roughly in proportion to the optical output of the amplified spontaneous emission which contains little of the signal light component.

In other words, when the optical output of the amplified spontaneous emission which is measured by the light sensor 32 is represented by Pap, the total optical output Pat of the amplified spontaneous emission which is contained in the total optical output measured by the light sensor 22 is approximately represented by the following equation using a proper proportionality constant α.

$$Pat = \alpha Pat \quad (3)$$

According to Equation (1) and Equation (2) above, the optical output of the amplified signal light is approximately calculated by the following equation using the optical outputs Pt and Pap which are measured by the light sensor 22 and the light sensor 32.

$$Ps = Pt - \alpha Pat \quad (3)$$

That is, the outputs of the light sensor 22 and the light sensor 32 may be subjected to a subtracting process according to Equation (3) by an operational amplifier 50 to acquire a monitor signal which is proportional to only the optical output of the amplified signal light, and the level of the amplified signal light may be controlled with high precision through control of the gain of the light-amplifying section 10 so as to produce the monitor signal at a constant level.

The proportionality constant α mentioned above may be preset to a value which is determined so that the result of the operation according to Equation (3) is zero when no signal light is inputted to the light-amplifying section 10.

Figure 4:
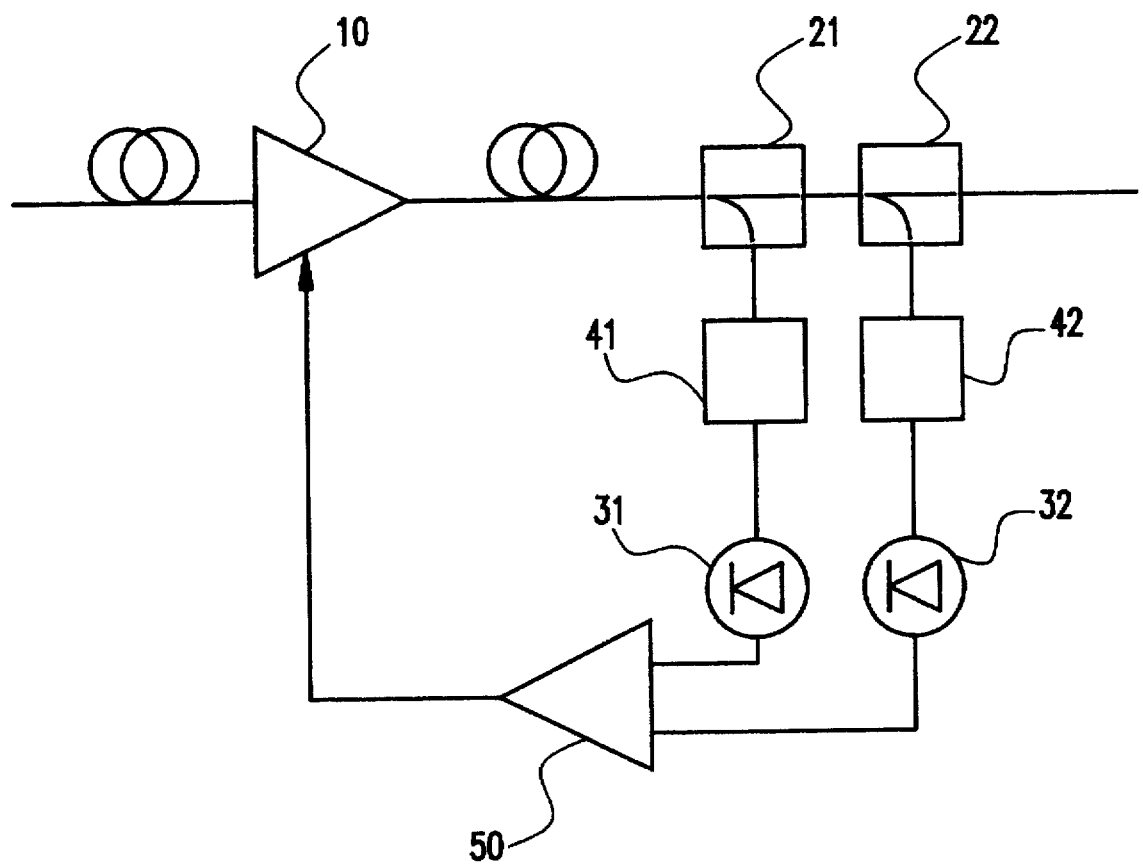
FIG. 4 is a schematic view of another embodiment of the optical amplifier according to this invention.

Another embodiment of the optical amplifier according to this invention will now be explained with reference to FIG. 4 and FIGS. 5(a)–(d). FIG. 4 is a schematic view of another embodiment of the optical amplifier according to this invention. In addition, FIG. 5 illustrates views of the spectra of light observed in the other embodiment of the optical amplifier according to this invention.

The other embodiment of the optical amplifier according to this invention which is illustrated in FIG. 4 is different from the embodiment illustrated in FIG. 2 in that an additional first band-pass filter 41 is also placed between the first optical branching coupler 21 and the first light sensor 31. The rest of the configuration is the same as that illustrated in FIG. 2.

Of the amplified light branched through the first optical branching coupler 21, the second embodiment admits only light with wavelengths equal to or near the center wavelength of the amplified signal light. The passed light is received by the light sensor 31 which measures the optical output. That is, this embodiment extracts only the amplified light with wavelengths near the center wavelength from which the amplified emission with wavelengths apart from the center wavelength has been removed by the band-pass filter 41 in advance, unlike the embodiment illustrated in FIG. 2 which measures the level of the optical output of light over all the wavelengths of the amplified signal light. It is designed so that the artificial level of the optical output of the amplified spontaneous emission which is measured by the second light sensor 32 is subtracted from the level of the output of the amplified light with wavelengths near the center wavelength.

The configuration designed in this way allows higher-precision calculation of the level of the optical output of light equivalent to the actually contained amplified spontaneous emission on the basis of the level of the optical output which is measured by the second light sensor 32.

Figure 5A:
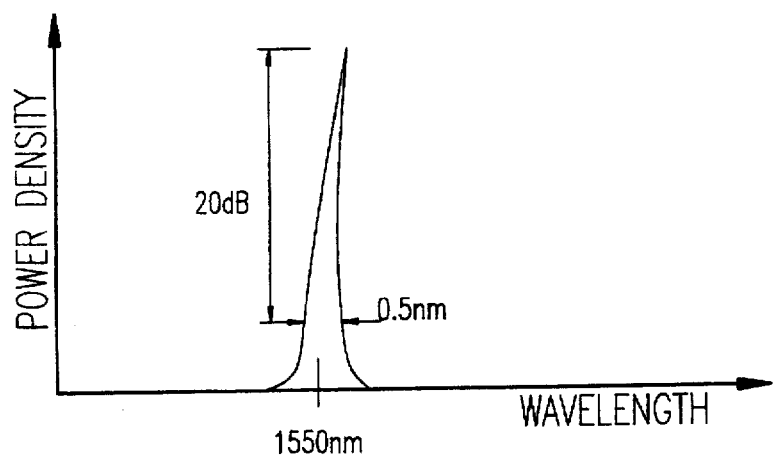
FIGS. 5(a)–(d) illustrate views of the spectra of light observed at several positions in the other embodiment of the optical amplifier according to this invention.
Figure 5B:
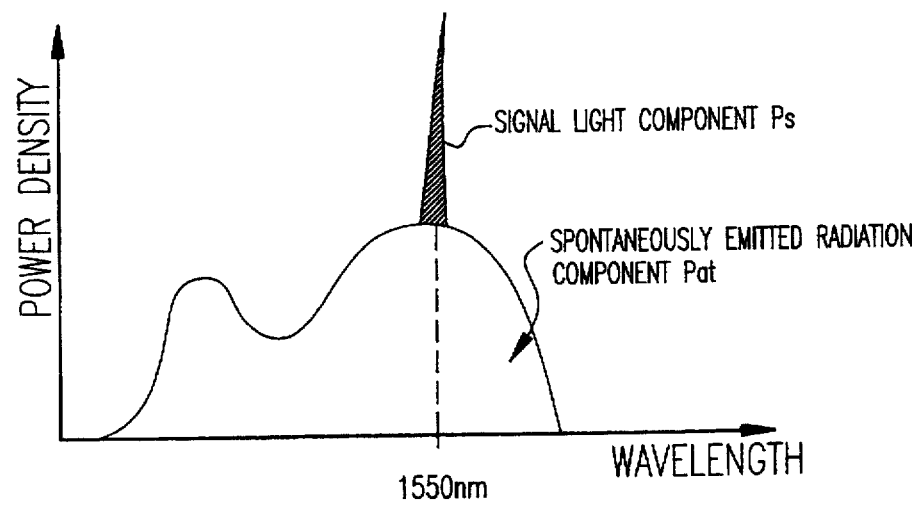
Figure 5C:
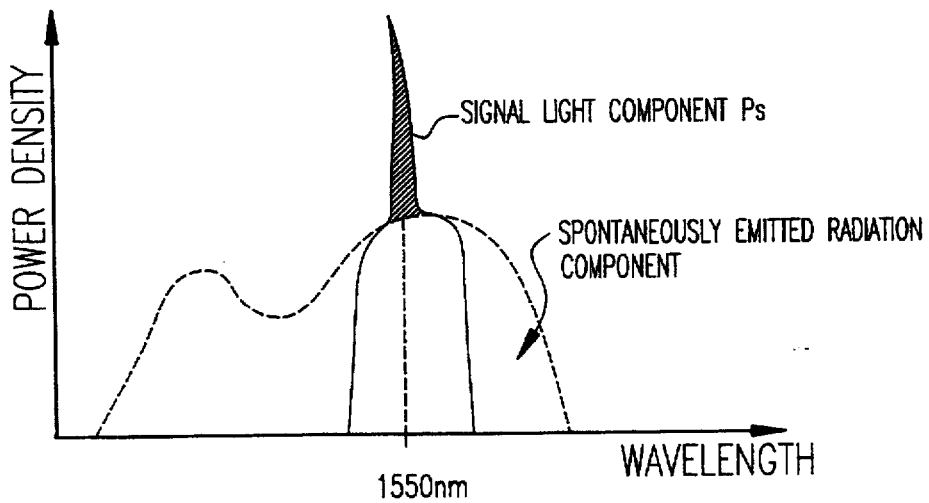

FIGS. 5(a)–(d) are schematic views illustrative of the spectra of the amplified light. FIG. 5(a) illustrates the spectrum of the inputted signal light, as is the case of FIG. 3(a). FIG. 5(b) illustrates the spectrum of the light amplified through the light-amplifying section 10. FIG. 5(c) illustrates the spectrum of the light which has been branched through the first optical branching coupler 21 and has passed through the band-pass filter 41. The band-pass filter used admits only light having the 20 dB suppression width which is in a band of wavelengths of ±5 nm with respect to the center wavelength of the signal light, 1,550 nm.

Figure 5D:
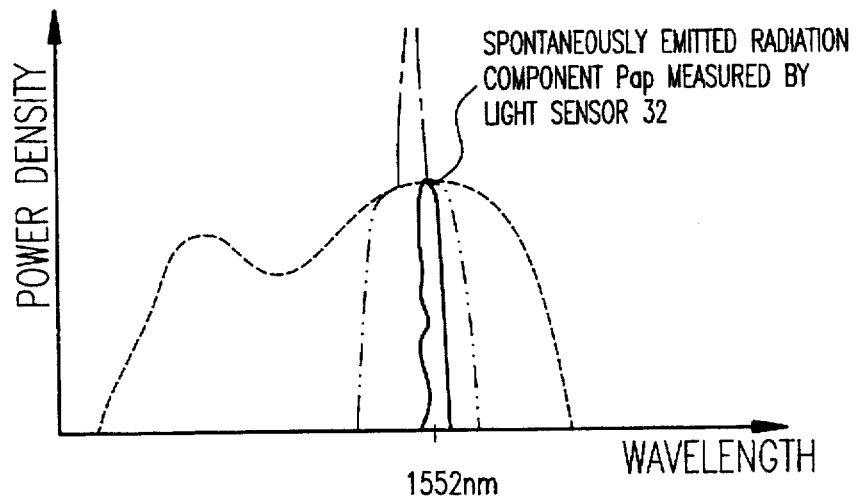

In contrast, FIG. 5(d) illustrates the spectrum of the light which has been branched through the second optical branching coupler 22 and has passed through the second band-pass filter 42. This second band-pass filter 42 used here is the same type as that used in the embodiment illustrated in FIG. 2.

Referring to FIG. 5 (d), the level of the optical output of the apmlified spontaneous emission which is contained in the level of the optical output of the amplified light having a spectrum inclusive of the center wavelength of the signal light which is represented by the alternate long and short dash line, is calculated on the basis of the level of the optical output calculated based on the light with wavelengths near the center wavelength which is indicted by the solid line. The level of the optical output of the amplified spontaneous emission calculated in this way is subtracted from the actually measured level of the optical output of the amplified light by the operational amplifier 50. Also for the case using this embodiment, the proportionality constant α for the subtracting process may be set in such a manner that the result of the operation according to Equation (3) is zero when no signal light is inputted to the light-amplifying section 10, as is the case of the first-described embodiment.

As a result, the level of the optical output of the amplified pure signal light alone which is illustrated in FIG. 5(b) or (c) as the diagonally shaded portion is calculated, and a monitor signal for controlling the feedback, which is determined on the basis of the result of the calculation, is sent to the light-amplifying section 10. The monitor signal, being acquired at all times through measurement of both the light having a spectrum inclusive of the center wavelength of the signal light and the light having a spectrum with wavelengths only near the center wavelength and the subsequent subtraction processing, is much less susceptible to the influence of possible variation in the spontaneously emitted radiation which is contained in the amplified light. Accordingly, without being influenced by the variation in the amplified spontaneous emission, the level of the optical output of the signal light amplified with high precision may be extracted to control the feedback on the basis of the extracted level, thus allowing provision of a stable optical amplification transmission system.

FIG. 2 and FIG. 4, which illustrate the embodiments of the optical amplifier according to this invention, do not show details of the light-amplifying section. However, needless to mention, either of the optical fiber amplifiers and semiconductor optical amplifiers may be used in practice as the light-amplifying section. When an optical fiber amplifier is used, the gain may be controlled through control of the current injected into a semiconductor laser diode as the pumping light source. On the other hand, in cases where the section is a semiconductor optical amplifier, the gain control may be easily accomplished through control of the current injected into the semiconductor.

In addition, the band-pass filter for a narrow wavelength band, which is used in the optical amplifier according to this invention, may be constructed of an interference filter made of a dielectric multi-layer membrane or a grating filter.

As described above, the optical amplifier according to this invention measures both the optical output of the sum of the spontaneously emitted radiation and the originally amplification-intended signal light, and the optical output of only the amplified spontaneous emission, regarding the output of the light amplified through the light-amplifying section. The difference between the two is then determined by a subtracting process and is used to control the gain of the light-amplifying section. As a result, higher-precision control of the optical amplification which is free from influence of variation in the amplified spontaneous emission may be accomplished to maintain a constant level of the output of the amplified light with high precision.

While this invention has been described in connection with certain preferred embodiments, it is to be understood that the subject matter encompassed byway of this invention is not to be limited to those specific embodiments. On the contrary, it is intended for the subject matter of the invention to include all the alternatives, modifications and equivalents as can be included within the spirit and scope of the following claims.

What is claimed is:

1. An optical amplifier comprising:
   light-amplifying means for directly amplifying an inputted optical signal which has been inputted using a stimulated emission phenomena, to generate an amplified optical signal;
   first optical branching means for branching pan of said amplified light to output first branching light;
   first light-sensing means for converting said first branching light into a first electrical signal to output said signal;
   second optical branching means for branching part of said amplified light to output second branching light;
   light-pass filter means which allows light, of said second branching light, with wavelengths in a predetermined specific band to pass, to output light with specific wavelengths;
   second light-sensing means for converting said light with specific wavelengths into a second electrical signal to output said signal;
   an operational amplifying medium for subjecting said first electrical signal and said second electrical signal to a subtracting process to output a differential signal; and
   gain control means for controlling a gain of said light-amplifying means on the basis of said differential signal so as to maintain a level of said optic;it signal at a constant value.

2. An optical amplifier as claimed in claim 1, wherein said specific wavelength band includes wavelengths other than the center wavelength of said inputted signal light.

3. An optical amplifier as claimed in claim 1, wherein said operational amplifying medium comprises subtracting means for subtracting a value obtained by multiplying an optical output of said light with specific wavelengths by a predetermined constant, from the optical output of said first branching light so as to remove the amplified spontaneous emission from said first branching light.

4. An optical amplifier as claimed in claim 3, wherein said light-amplifying means includes an optical fiber amplifier comprising an amplifying optical fiber and a pumping light source for inputting pumping light to said amplifying optical fiber.

5. An optical amplifier as claimed in claim 4, wherein said gain control means comprises control means for controlling current to be injected into said pumping light source.

6. An optical amplifier as claimed in claim 3, wherein said light-amplifying means comprises a semiconductor optical amplifier.

7. An optical amplifier as claimed in claim 6, wherein said gain control means comprises control means for controlling current to be injected into said semiconductor optical amplifier.

8. An optical amplifier comprising:
   light-amplifying means for directly amplifying an inputted optical signal which has been inputted using a stimulated emission phenomena, to generate an amplified optical signal;
   first optical branching means for branching part of said amplified light to output first branching light;
   first light-pass filter means which allows light, of said first branching light, with wavelengths in a predetermined specific band to pass, to output first light with specific wavelengths;
   second optical branching means for branching part of said amplified light to output second branching light;
   second light-pass filter means which allows light, of said second branching light, with wavelengths in a predetermined specific band to pass, to output second light with specific wavelengths;
   second light-sensing means for converting said light with specific wavelengths into a second electrical signal to output said signal;
   an operational amplifying medium for subjecting said first electrical signal and said second electrical signal to a subtracting process to output a differential signal; and
   gain control means for controlling a gain of said light-amplifying means on the basis of said differential signal so as to maintain a level of said optical signal at a constant value.

9. An optical amplifier as claimed in claim 8, wherein said first specific wavelength band is set as a band which includes wavelengths other than or equal to the center wavelength of said inputted signal light, and said second specific wavelength band is set as a band which includes wavelengths other than the center wavelength of said inputted signal light.

10. An optical amplifier as claimed in claim 8, wherein said operational amplifying medium comprises subtracting means for subtracting a value obtained by multiplying an optical output of said light with specific wavelengths by a predetermined constant, from an optical output of said first branching light so as to remove the amplified spontaneous emission from said first branching light.

11. An optical amplifier as claimed in claim 10, wherein said light-amplifying means includes an optical fiber amplifier comprising an amplifying optical fiber and a pumping light source for inputting pumping light to said amplifying optical fiber.

12. An optical amplifier as claimed in claim 11, wherein said gain control means comprises control means for controlling current to be injected into said pumping light source.

13. An optical amplifier as claimed in claim 12, wherein said light-amplifying means comprises a semiconductor optical amplifier.

14. An optical amplifier as claimed in claim 13, wherein said gain control means comprises control means for controlling current to be injected into said semiconductor optical amplifier.

15. An optical amplifier comprising:
   light-amplifying means for directly amplifying inputted signal light which has been inputted using a stimulated emission phenomena, to generate amplified light;
   amplified signal light-extracting means for removing amplified spontaneous emmission from said amplified light to extract the amplified signal light with the same wavelengths as said inputted signal light;
   level-measuring means for measuring a level of said amplified signal light to optput the level of the amplified signal light; and
   gain control means for controlloing a gain of said light-amplifying means so as to maintain an optical output of said amplified light at a constant level on the basis of said level of the amplified signal light,
   wherein said amplified signal light-extracting means comprises a first coupler for receiving said amplified light and for producing first and second outputs based on said amplified light, and a second coupler for recieving said second output of said first coupler and for producing first and second outputs, and wherein said level-measuring means comprises a first light sensor for receiving said first output of said first coupler, wherein said amplified signal light-extracting means further comprises a first bandpass filter coupled between said first light sensor and said first coupler, and a second bandpass filter for receiving said first output of said second coupler, wherein said level-measuring means further comprises a second light sensor coupled to an output of said second bandpass filter, and wherein said gain control means comprises an operational amplifier for receiving outputs from said first and second light sensors.

\* \* \* \* \*